(12) United States Patent
Golara

(10) Patent No.: US 11,003,202 B2
(45) Date of Patent: *May 11, 2021

(54) PMOS-OUTPUT LDO WITH FULL SPECTRUM PSR

(71) Applicant: QUALCOMM Incorporated, San Diego, CA (US)

(72) Inventor: Soheil Golara, San Jose, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/808,806

(22) Filed: Mar. 4, 2020

(65) Prior Publication Data
US 2020/0201374 A1 Jun. 25, 2020

Related U.S. Application Data

(63) Continuation of application No. 16/161,111, filed on Oct. 16, 2018, now Pat. No. 10,591,938.

(51) Int. Cl.
*G05F 1/571* (2006.01)
*G05F 1/59* (2006.01)
(Continued)

(52) U.S. Cl.
CPC ............... *G05F 1/575* (2013.01); *G05F 1/59* (2013.01); *H03F 3/45183* (2013.01); *H03F 2200/129* (2013.01); *H03F 2203/45528* (2013.01)

(58) Field of Classification Search
CPC . G05F 1/575; G05F 1/59; G05F 3/222; H03F 3/45183
See application file for complete search history.

(56) References Cited

U.S. PATENT DOCUMENTS 5,631,598 A 5/1997 Miranda et al.
6,046,577 A 4/2000 Rincon-Mora et al.
(Continued)

FOREIGN PATENT DOCUMENTS

CN 1175018 A 3/1998
CN 100367142 C 2/2008
(Continued)

OTHER PUBLICATIONS

Akhamal H., et al., "Fast Transient Response Low Drop-out Voltage Regulator," International Journal of Embedded Systems and Applications (IJESA), Sep. 2014, vol. 4, No. 2/3, pp. 1-10.
(Continued)

*Primary Examiner* — Thienvu V Tran
*Assistant Examiner* — Sisay G Tiku
(74) *Attorney, Agent, or Firm* — Chui-kiu Teresa Wong

(57) ABSTRACT

A PMOS-output LDO with full spectrum PSR is disclosed. In one implementation, a LDO includes a pass transistor ($M_O$) having a source coupled to an input voltage (Vin); a noise cancelling transistor ($M_D$) having a source coupled to the Vin, a gate coupled to a drain and a gate of the pass transistor; a source follower transistor ($M_{SF}$) having a source coupled to a drain of the pass transistor, a drain coupled to the drain and gate of the noise cancelling transistor; a current sink coupled between the drain of the source follower transistor and ground; and an error amplifier having an output to drive the gate of the source follower transistor.

7 Claims, 7 Drawing Sheets

(51) Int. Cl.
*G05F 3/22* (2006.01)
*H03F 3/45* (2006.01)
*G05F 1/575* (2006.01)

(56) References Cited

U.S. PATENT DOCUMENTS

| | | | |
|---|---|---|---|
| 6,147,550 A | 11/2000 | Holloway | |
| 6,188,211 B1 | 2/2001 | Rincon-Mora et al. | |
| 6,188,212 B1 * | 2/2001 | Larson | G05F 1/56 323/274 |
| 6,359,427 B1 | 3/2002 | Edwards et al. | |
| 6,522,111 B2 | 2/2003 | Zadeh et al. | |
| 6,586,917 B1 | 7/2003 | Smith | |
| 6,617,832 B1 | 9/2003 | Kobayashi | |
| 6,791,390 B2 | 9/2004 | Gay | |
| 6,856,124 B2 | 2/2005 | Dearn et al. | |
| 7,109,690 B2 | 9/2006 | Ke et al. | |
| 7,148,670 B2 | 12/2006 | Inn et al. | |
| 7,492,137 B2 | 2/2009 | Yamada | |
| 7,495,420 B2 | 2/2009 | Vinn | |
| 7,504,814 B2 | 3/2009 | Lee et al. | |
| 7,548,051 B1 | 6/2009 | Tenbroek et al. | |
| 7,710,090 B1 | 5/2010 | Kimura | |
| 7,893,670 B2 | 2/2011 | Pulijala et al. | |
| 8,072,196 B1 | 12/2011 | Li | |
| 8,080,983 B2 | 12/2011 | Lourens et al. | |
| 8,115,463 B2 | 2/2012 | Wang | |
| 8,154,263 B1 | 4/2012 | Shi et al. | |
| 8,248,150 B2 | 8/2012 | Tadeparthy et al. | |
| 8,294,441 B2 | 10/2012 | Gurcan et al. | |
| 8,841,893 B2 | 9/2014 | Bulzacchelli et al. | |
| 9,170,590 B2 | 10/2015 | Price et al. | |
| 9,223,329 B2 | 12/2015 | Pulvirenti et al. | |
| 9,274,534 B2 | 3/2016 | Fang et al. | |
| 9,292,026 B2 * | 3/2016 | Bhattad | H02M 1/32 |
| 9,377,798 B2 | 6/2016 | Bhattad | |
| 9,543,826 B2 | 1/2017 | Chen et al. | |
| 9,577,508 B2 | 2/2017 | Wang | |
| 9,588,541 B1 * | 3/2017 | Ho | G05F 1/573 |
| 9,608,522 B2 | 3/2017 | Lin et al. | |
| 9,684,325 B1 | 6/2017 | Rasmus | |
| 9,740,225 B1 | 8/2017 | Wong | |
| 9,746,864 B1 | 8/2017 | Narang et al. | |
| 9,778,672 B1 | 10/2017 | Gao et al. | |
| 9,946,283 B1 | 4/2018 | Yung et al. | |
| 9,983,604 B2 | 5/2018 | Lee et al. | |
| 10,013,005 B1 * | 7/2018 | Ippili | G05F 1/468 |
| 10,133,289 B1 | 11/2018 | Ankamreddi et al. | |
| 10,234,883 B1 * | 3/2019 | Du | G05F 1/614 |
| 10,310,530 B1 * | 6/2019 | Lu | G05F 1/575 |
| 10,411,599 B1 | 9/2019 | Shi et al. | |
| 10,444,780 B1 | 10/2019 | Cheng et al. | |
| 10,459,468 B1 | 10/2019 | Ankamreddi et al. | |
| 10,545,523 B1 * | 1/2020 | Wu | G05F 1/595 |
| 10,591,938 B1 * | 3/2020 | Golara | H03F 3/45183 |
| 2003/0224624 A1 | 12/2003 | Gay | |
| 2004/0004468 A1 | 1/2004 | Dearn et al. | |
| 2004/0027097 A1 | 2/2004 | Denicholas et al. | |
| 2004/0140845 A1 | 7/2004 | Eberlein | |
| 2005/0189930 A1 | 9/2005 | Wu et al. | |
| 2005/0206444 A1 | 9/2005 | Perez et al. | |
| 2005/0248331 A1 | 11/2005 | Whittaker et al. | |
| 2006/0164053 A1 | 7/2006 | Walter et al. | |
| 2006/0181258 A1 | 8/2006 | Benbrik | |
| 2007/0057655 A1 | 3/2007 | Nishida | |
| 2007/0139030 A1 | 6/2007 | Lee et al. | |
| 2007/0242536 A1 | 10/2007 | Matsubara | |
| 2008/0174289 A1 | 7/2008 | Gurcan et al. | |
| 2008/0211467 A1 | 9/2008 | Huang et al. | |
| 2008/0278127 A1 | 11/2008 | Nagata | |
| 2008/0303496 A1 | 12/2008 | Schlueter et al. | |
| 2009/0010035 A1 | 1/2009 | Williams | |
| 2009/0179622 A1 | 7/2009 | Ivanov et al. | |
| 2009/0189591 A1 | 7/2009 | Sperling et al. | |
| 2009/0243568 A1 | 10/2009 | Nguyen | |
| 2009/0322429 A1 | 12/2009 | Ivanov et al. | |
| 2010/0213917 A1 | 8/2010 | Pulijala et al. | |
| 2010/0327959 A1 | 12/2010 | Lee | |
| 2011/0089916 A1 | 4/2011 | Soenen et al. | |
| 2012/0112718 A1 | 5/2012 | Pons | |
| 2012/0187897 A1 | 7/2012 | Lenk et al. | |
| 2012/0229111 A1 | 9/2012 | Serdarevic | |
| 2012/0299564 A1 | 11/2012 | Howes et al. | |
| 2013/0082671 A1 | 4/2013 | Ivanov et al. | |
| 2013/0099764 A1 | 4/2013 | Zhang et al. | |
| 2013/0113447 A1 | 5/2013 | Kadanka | |
| 2013/0181521 A1 | 7/2013 | Khlat | |
| 2013/0221940 A1 | 8/2013 | Yan et al. | |
| 2014/0042998 A1 | 2/2014 | Saito et al. | |
| 2014/0084896 A1 | 3/2014 | Zhang et al. | |
| 2014/0139197 A1 | 5/2014 | Price et al. | |
| 2014/0139198 A1 | 5/2014 | Manlove et al. | |
| 2014/0176098 A1 * | 6/2014 | Fang | G05F 1/575 323/280 |
| 2014/0266103 A1 | 9/2014 | Wang et al. | |
| 2014/0277812 A1 | 9/2014 | Shih et al. | |
| 2014/0306676 A1 | 10/2014 | Hu et al. | |
| 2015/0028828 A1 | 1/2015 | Chen | |
| 2015/0103566 A1 | 4/2015 | Keogh et al. | |
| 2015/0115809 A1 | 4/2015 | Siessegger | |
| 2015/0115830 A1 | 4/2015 | Siessegger | |
| 2015/0130434 A1 * | 5/2015 | Jain | G05F 1/575 323/280 |
| 2015/0137780 A1 | 5/2015 | Lerner et al. | |
| 2015/0160668 A1 | 6/2015 | Pujol et al. | |
| 2015/0168969 A1 | 6/2015 | Shor | |
| 2015/0188421 A1 | 7/2015 | Ko | |
| 2015/0192943 A1 | 7/2015 | Roham et al. | |
| 2015/0198959 A1 | 7/2015 | Kuttner | |
| 2015/0198960 A1 | 7/2015 | Zhang et al. | |
| 2015/0220096 A1 | 8/2015 | Luff | |
| 2015/0349622 A1 | 12/2015 | Lo et al. | |
| 2015/0362936 A1 | 12/2015 | Patel et al. | |
| 2016/0124448 A1 | 5/2016 | Murukumpet et al. | |
| 2016/0349776 A1 | 12/2016 | Conte et al. | |
| 2017/0045901 A1 | 2/2017 | Price et al. | |
| 2017/0052552 A1 | 2/2017 | Mahmoudi et al. | |
| 2017/0117803 A1 | 4/2017 | Matsuki et al. | |
| 2017/0205841 A1 | 7/2017 | Jefremow et al. | |
| 2017/0212540 A1 | 7/2017 | Cho et al. | |
| 2017/0220059 A1 | 8/2017 | Kadowaki | |
| 2017/0322575 A1 | 11/2017 | Du et al. | |
| 2017/0364110 A1 | 12/2017 | Golara et al. | |
| 2017/0371365 A1 | 12/2017 | Kossel | |
| 2018/0217623 A1 | 8/2018 | Bhattad et al. | |
| 2019/0146532 A1 | 5/2019 | Ballarin et al. | |
| 2020/0201374 A1 | 6/2020 | Golara | |
| 2020/0244160 A1 * | 7/2020 | Mitev | G05F 1/575 |

FOREIGN PATENT DOCUMENTS

| | | |
|---|---|---|
| CN | 101419477 A | 4/2009 |
| CN | 102043417 A | 5/2011 |
| CN | 202494944 U | 10/2012 |
| CN | 203745939 U | 7/2014 |
| CN | 108445950 A | 8/2018 |
| EP | 1253498 A1 | 10/2002 |
| EP | 1508078 B1 | 12/2010 |
| EP | 2849020 A1 | 3/2015 |
| TW | 200933333 A | 8/2009 |
| TW | 201013355 A | 4/2010 |
| TW | I357204 B | 1/2012 |
| TW | I397793 B | 6/2013 |
| WO | WO-2012004083 A1 | 1/2012 |
| WO | WO-2012047738 A1 | 4/2012 |
| WO | 2014042726 A1 | 3/2014 |
| WO | 2014177901 A1 | 11/2014 |
| WO | 2015047276 A1 | 4/2015 |
| WO | WO-2016026416 A1 | 2/2016 |
| WO | 2016082420 A1 | 6/2016 |

(56) References Cited

FOREIGN PATENT DOCUMENTS

| WO | 2016202398 A1 | 12/2016 |
|---|---|---|
| WO | 2017075156 A1 | 5/2017 |

OTHER PUBLICATIONS

Alon E., et al., "Replica Compensated Linear Regulators for Supply-Regulated Phase-Locked Loops," IEEE Journal Of Solid-State Circuits, vol. 41, No. 2, Feb. 2006, pp. 413-424.

Assi A., et al., "A Fully Differential and Tunable CMOS Current Mode opamp Based on Transimpedance-Transconductance Technique", Circuits And Systems, 1997. Proceedings of the 40th Midwest Symposium On Sacramento, CA, USA Aug. 3-6, 1997, New York, NY, USA, IEEE, US, vol. 1, Aug. 3, 1997 (Aug. 3, 1997), pp. 168-171, XP010272437, DOI: 10.1109/MWSCAS.1997.666060, ISBN: 978-0-7803-3694-0.

Bontempo G., et al., "Low Supply Voltage, Low Quiescent Current, ULDO Linear Regulator," The 8th IEEE International Conference on Electronics, Circuits and Systems 2001, pp. 409-412.

Bulzacchelli J.F., et al., "Dual-Loop System of Distributed Microregulators With High DC Accuracy, Load Response Time Below 500 ps, and 85-mV Dropout Voltage," IEEE Journal Of Solid-State Circuits, vol. 47, No. 4, Apr. 2012, pp. 863-874.

Camacho D., et al., "An NMOS Low Dropout Voltage Regulator with Switched Floating Capacitor Gate Overdrive," Department of Electrical Engineering, Southern Methodist University, Dallas, Texas, USA, 52nd IEEE International Midwest Symposium on Circuits and Systems, Aug. 2009, pp. 808-811.

Chengpeng L., et al., "FVF LDO Regulator with Dual Dynamic-Load Composite Gain Stage", Analog Integrated Circuits and Signal Processing, Springer New York LLC, US, vol. 92, No. 1, Apr. 17, 2017 (Apr. 17, 2017), pp. 131-140, XP036245594, ISSN: 0925-1030, DOI: 10.1007 /S10470-017 -0972-9, [retrieved on Apr. 17, 2017], abstract; figure 3.

Den Besten G.W., et al., "Embedded 5 V-to-33 V Voltage Regulator for Supplying Digital IC's in 3.3 V CMOS Technology," IEEE Journal Of Solid-State Circuits, vol. 33, No. 7, Jul. 1998, pp. 956-962.

Guo J., et al., "A 6-µW Chip-Area-Efficient Output-Capacitorless LDO in 90-nm CMOS Technology", IEEE Journal of Solid-State Circuits, IEEE Service Center, Piscataway, NJ, USA, vol. 45, No. 9, Sep. 1, 2010 (Sep. 1, 2010), pp. 1896-1905, XP011317129, ISSN: 0018-9200, DOI: 10.1109/JSSC.2010.2053859, abstract; figure 6.

Gupta V., et al., "A Low Dropout, CMOS Regulator with High PSR over Wideband Frequencies", IEEE International Symposium on Circuits and Systems, May 2005, pp. 4245-4248.

Hazucha P., et al., "Area-Efficient Linear Regulator With Ultra-Fast Load Regulation", IEEE Journal of Solid-State Circuits, vol. 40, No. 4, Apr. 2005, pp. 933-940.

Hinojo J.M., et al., "FVF-Based Low-Dropout Voltage Regulator with Fast Charging/Discharging Paths for Fast Line and Load Regulation", ETRI Journal, vol. 39, No. 3, Jun. 1, 2017 (Jun. 1, 2017), pp. 373-382, XP055646709, KR ISSN: 1225-6463, DOI: 10.4218/etrij.17.0116.0766, abstract; figure 3.

Huang H-Y., et al., "A Wideband CMOS Transconductance-Transimpedance Amplifier", Midwest Symposium On Circuits And Systems. Cairo, Egypt, Dec. 27-30, 2003; [Midwest Symposium On Circuits And Systems], Piscataway, NJ, IEEE, US, vol. 1, Dec. 27, 2003 (Dec. 27, 2003), pp. 153-156, XP010867413, DOI: 10.1109/MWSCAS.2003.1562241, ISBN: 978-0-7803-8294-7.

Lu Y., et al., "A 0.65ns-Response-Time 3.01ps FOM Fully-Integrated Low-Dropout Regulator with Full-Spectrum Power-Supply—Rejection for Wideband Communication Systems," IEEE International Solid-State Circuits Conference, Technical Papers, Feb. 2014, pp. 306-307. Retrieved from the Internet: URL:http://www.researchgate.net/publication/271550565.

Milliken R.J., et al., "Full on-chip CMOS low-dropout voltage regulator", IEEE Transactions on Circuits and Systems I: Regular Papers, vol. 54, No. 9, Sep. 2007, pp. 1879-1890.

Rincon-Mora G.A., et al., "A Low-Voltage, Low Quiescent Current, Low Drop-Out Regulator," IEEE Journal of Solid-State Circuits, Jan. 1998, vol. 33, No. 1, pp. 36-44.

Teel J.C., "Understanding power supply ripple rejection in linear regulators", Analog Applications Journal, Analog and Mixed-Signal Products, 2005, 4 Pages.

International Preliminary Report on Patentability—PCT/US2017/022195, The International Bureau of WIPO—Geneva, Switzerland, dated Jun. 14, 2018.

International Search Report and Written Opinion—PCT/US2019/046727—ISA/EPO—dated Nov. 21, 2019.

International Search Report and Written Opinion—PCT/US2016/059023—ISA/EPO—dated Feb. 27, 2017.

International Search Report and Written Opinion—PCT/US2017/022195—ISA/EPO—dated May 26, 2017.

International Search Report and Written Opinion—PCT/US2017/056758—ISA/EPO—dated Mar. 23, 2018.

Partial International Search Report—PCT/US2019/048075—ISA/EPO—dated Dec. 4, 2019.

Partial International Search Report—PCT/US2017/056758—ISA/EPO—dated Jan. 30, 2018.

Paxton A., "Extend Battery Life with a LDO, a Voltage Supervisor and a FET", Jul. 31, 2017 (Jul. 31, 2017), XP055671473, 5 pages, Retrieved from the Internet: URL: https://web.archive.org/web/20170731140511/http://e2e.ti.com:80/blogs_/archives/b/fullycharged/archive/2017/02/21/extend-battery-life-with-a-ldo-a-voltage-supervisor-and-a-fet [retrieved on Feb. 25, 2020] p. 2-p. 5.

\* cited by examiner

PMOS-OUTPUT LDO WITH FULL SPECTRUM PSR

CROSS-REFERENCE TO RELATED APPLICATION

This application is a continuation of U.S. application Ser. No. 16/161,111, entitled "PMOS-OUTPUT LDO WITH FULL SPECTRUM PSR" and filed on Oct. 16, 2018, and assigned to the assignee hereof, which is hereby expressly incorporated by reference in its entirety herein.

FIELD OF DISCLOSURE

Aspects of the present disclosure relate generally to semiconductor circuits, and more particularly to low dropout regulator (LDO) with full spectrum power supply rejection (PSR).

BACKGROUND

Today, in many Systems on a Chip (SoC's), one or more regulated voltages are used to power various subsystems within a SoC. Various types of voltage regulators have been developed to supply regulated voltages to different subsystems within the SoC. In general, a voltage regulator generates a regulated output voltage from an input voltage. In low power applications, voltage regulators are often used to generate a lower regulated output voltage than the input voltage. One common type of such voltage regulator is a low dropout regulator (LDO). LDOs can generally be classified into two types, namely, n-type output LDOs and p-type output LDOs.

FIG. 1 shows a conventional n-type output LDO 100. LDO 100 includes an error amplifier 110, a pass transistor 120, a feedback resistor 130, and a resistor 140. Error amplifier 110 has a positive input terminal, a negative input terminal, an output, and a voltage supply input terminal. The voltage supply input terminal is coupled to a voltage supply Vdd, which can be at about 1.2V in some examples. The positive input terminal is configured to receive a reference voltage Vref. The negative input terminal is coupled to one end of feedback resistor 130 and one end of resistor 140. The other end of resistor 140 is coupled to ground. The output of error amplifier 110 is coupled to a gate of pass transistor 120. Pass transistor 120 is an n-type metal oxide semiconductor transistor (NMOS). Thus, LDO 100 is also referred to as an NMOS-output LDO. The drain of pass transistor 120 is configured to receive an input voltage Vin, which can be about 0.85V in some examples. Note that Vdd is higher than Vin typically for the conventional n-type output LDO 100. A source of pass transistor 120 is configured to produce an output voltage Vout of LDO 100. The source is also coupled to the other end of feedback resistor 130 so that Vout is feedback to error amplifier 110 via the feedback resistor 130. In other words, error amplifier 110, pass transistor 120, and feedback resistor 130 form a feedback loop within LDO 100. The output voltage Vout is provided to a load, which is represented by a load capacitor 150 and a current source 160, which are coupled to each other in parallel to the ground.

One important parameter that is often used to evaluate LDO's is power supply ripple rejection ratio (PSRR). It is a measure of the output ripple compared to the input ripple over a wide frequency range (e.g., 10 Hz to 10 MHz) and is expressed in decibels (dB). One common way to calculate PSRR for an LDO is:

$$PSRR = 20 \log(A_v/A_{vo}),$$

where $A_v$ is the open-loop gain of the LDO feedback loop and $A_{vo}$ is the gain from Vin to Vout with the LDO feedback loop open. Thus, PSRR measures how well the LDO rejects ripple coming from the input power supply at different frequencies.

Although the conventional n-type output LDO 100 can provide good PSRR and faster transient response, LDO 100 requires an additional higher voltage supply, namely, Vdd, to bias error amplifier 110. The other type of conventional LDO, p-type output LDO, does not require an additional higher voltage supply, and one example of such a LDO is discussed below.

FIG. 2 shows a conventional p-type output LDO 200. LDO 200 includes an error amplifier 210, a pass transistor 220, a feedback resistor 230, and a resistor 240. Error amplifier 210 has a positive input terminal, a negative input terminal, an output, and a voltage supply input terminal. Error amplifier 210 has a positive input terminal, a negative input terminal, an output, and a voltage supply input terminal. The voltage supply input terminal is coupled to an input voltage Vin. The negative input terminal is coupled to one end of feedback resistor 230 and one end of resistor 240. The other end of resistor 240 is coupled to ground. The output of error amplifier 210 is coupled to a gate of pass transistor 220. Pass transistor 220 is a p-type metal oxide semiconductor transistor (PMOS). The source of pass transistor 220 is configured to receive the input voltage Vin. A drain of pass transistor 220 is configured to produce an output voltage Vout of LDO 200. The drain is also coupled to the other end of feedback resistor 240. The output voltage Vout is provided to a load, which is represented by a load capacitor 250 and a current source 260, which are coupled to each other in parallel to the ground. The p-type output LDO 200 uses Vin to bias error amplifier 210, and hence, LDO 200 does not require any voltage supply in addition to Vin. However, LDO 200 suffers from poor PSRR at mid-range frequencies, and hence, typically requires a larger load capacitor 250 to reduce power supply rejection (PSR). The larger load capacitor 250 increases the size of LDO 200.

Accordingly, there is a need in the art to design a LDO that does not require any voltage supply in addition to the input voltage Vin, while providing better PSRR in all ranges of frequency.

SUMMARY OF THE DISCLOSURE

The following presents a simplified summary of one or more embodiments in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

In one implementation, a LDO includes a pass transistor ($M_O$) having a source, a drain, and a gate, the source coupled to an input voltage (Vin); a noise cancelling transistor ($M_D$)

having a source, a drain, and a gate, the source coupled to the Vin, the gate coupled to the drain of the noise cancelling transistor and the gate of the pass transistor; a source follower transistor ($M_{SF}$) having a source, a drain, and a gate, the source coupled to the drain of the pass transistor, the drain coupled to the drain and gate of the noise cancelling transistor; a current sink coupled between the drain of the source follower transistor and ground; an error amplifier having an output, a positive input terminal, and a negative input terminal, the output coupled to the gate of the source follower transistor, the positive input terminal configured to receive a reference voltage (Vref); and a feedback resistor coupled between the drain of the pass transistor and the negative input terminal of the error amplifier.

In one implementation, the LDO further includes a load capacitor coupled between the drain of the pass transistor and ground. The load capacitor has a capacitance of about 2 pF.

In some implementations, the source follower transistor, the feedback resistor, and the error amplifier are configured into a first loop. Furthermore, the pass transistor, the noise canceling transistor, and the source follower transistor can be configured into a second loop. Further, the first loop can be configured to be a slow loop and the second loop can be configured to be a fast loop.

In some implementations, the error amplifier comprises a pair of p-type transistors configured as a current mirror, and sources of the pair of p-type transistors are coupled to Vin.

In some implementations, the error amplifier further comprises a first n-type transistor configured as the positive input terminal and a second n-type transistor configured as the negative input terminal.

A method to provide a regulated low voltage from an input voltage (Vin) has been disclosed herein. In some implementations, the method includes receiving the input voltage at a source of a pass transistor ($M_O$); coupling a source of a noise cancelling transistor ($M_D$) to the source of the pass transistor, wherein the noise cancelling transistor is configured into a diode; coupling a source of a source follower transistor ($M_{SF}$) to the drain of the pass transistor, and coupling a drain of the source follower transistor to a drain and a gate of the noise cancelling transistor; coupling a current sink between the drain of the source follower transistor and ground; receiving a reference voltage (Vref) at a positive input terminal of the error amplifier; coupling a feedback resistor between the drain of the pass transistor and a negative input terminal of the error amplifier to provide a feedback voltage to the error amplifier; generating an output of the error amplifier based on the feedback voltage and the reference voltage; and driving the gate of the source follower transistor with the output of the error amplifier.

In some implementations, the method further includes coupling a load capacitor between the drain of the pass transistor and ground. The load capacitor has a capacitance of about 2 pF.

In some implementations, the method further includes configuring the source follower transistor, the feedback resistor, and the error amplifier into a first loop. In some implementations, the method further includes configuring the pass transistor, the noise canceling transistor, and the source follower transistor into a second loop. The first loop can be a slow loop and the second loop can be a fast loop.

In some implementations, the error amplifier comprises a pair of p-type transistors configured as a current mirror, and sources of the pair of p-type transistors are coupled to Vin. Moreover, the error amplifier can further include a first n-type transistor configured as the positive input terminal and a second n-type transistor configured as the negative input terminal.

An apparatus to provide a regulated low voltage from an input voltage (Vin) has been disclosed herein. In some implementations, the apparatus includes means for providing a slow loop to define an output voltage; and means for providing a fast loop to improve transient response, wherein the fast loop includes means for noise cancelling to improve power supply ripple rejection ratio (PSRR).

In some implementations, the slow loop includes a source follower transistor, a feedback resistor, and an error amplifier.

In some implementations, the fast loop includes a pass transistor, a noise canceling transistor, and the source follower transistor.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

In order to provide a LDO with good PSRR in all ranges of frequency without using any voltage supply in addition to the input voltage (Vin), a fast loop and a slow loop are configured within a PMOS output LDO according to one aspect of the disclosure. The slow loop may include an error amplifier, a source follower transistor, and a feedback resistor to define an output of the LDO. The fast loop may include the source follower transistor, a pass transistor, and a noise cancelling transistor. Both the noise cancelling transistor and the pass transistor are connected together at their gates. The sources of both the noise cancelling transistor and the pass transistor are configured to receive Vin. Further, the noise cancelling transistor is diode-connected, and hence, the noise cancelling transistor can effectively cancel noise in Vin by putting the noise in Vin onto the gate of pass transistor. In some implementations, the drain of the noise cancelling transistor is directly coupled to the drain of the source follower transistor. By directly connecting the drains of the source follow transistor and the noise cancelling transistor, the fast loop can be made more stable because there is only one low frequency pole. In some implementations, the drains of the source follow transistor and the noise cancelling transistor is further coupled to a current sink. When load current increases significantly (e.g., from 4 mA to 10 mA), the current sink can sink more current momentarily until the slow loop can catch up. These and other advantageous features may be better appreciated through the following detailed description of various implementations of the LDO.

Figure 3:
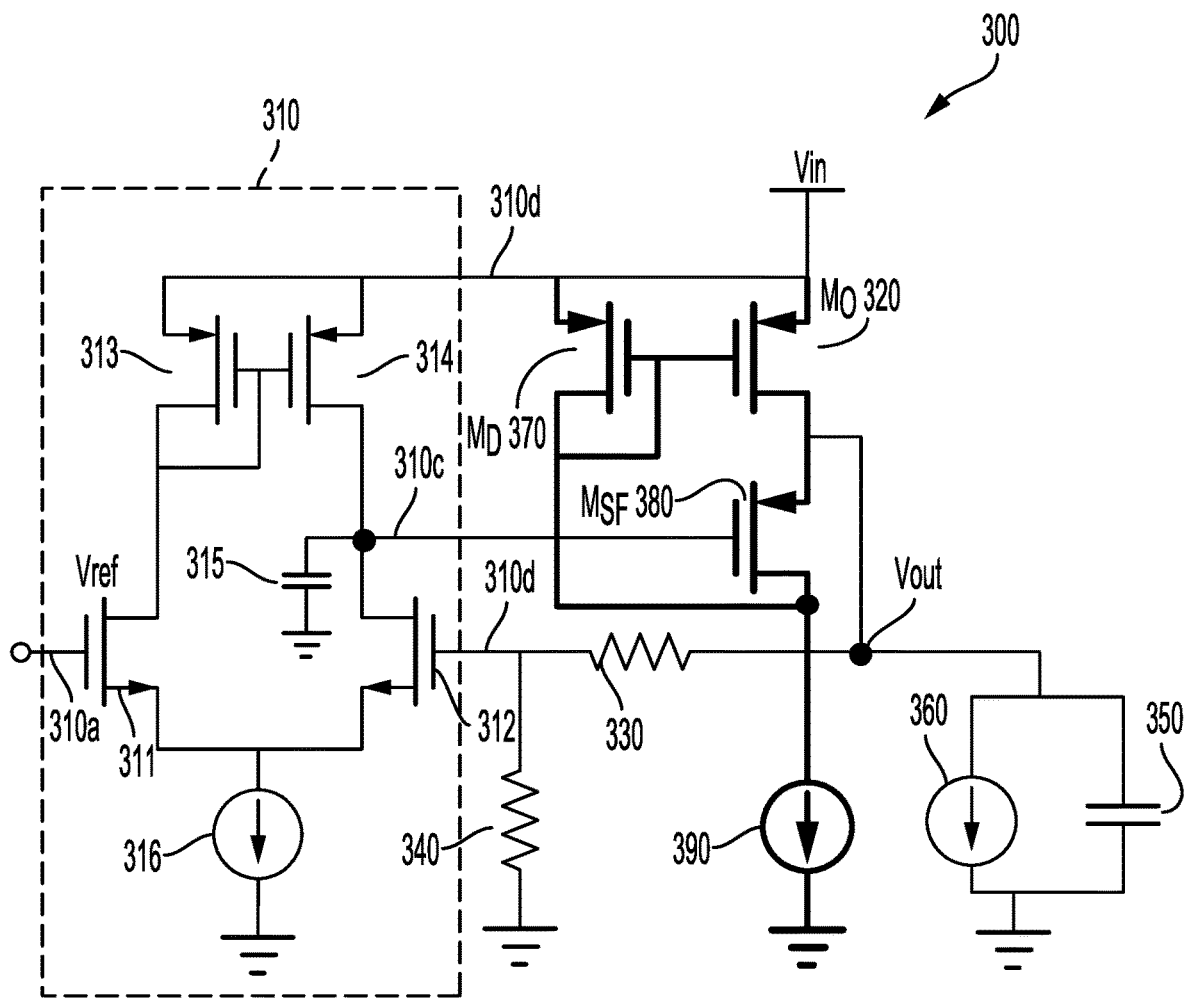
FIG. 3 shows one implementation of a p-type output LDO 300.

FIG. 3 shows one implementation of a p-type output LDO 300. LDO 300 includes an error amplifier 310, a pass transistor $M_O$ 320, a feedback resistor 330, a resistor 340, a load capacitor 350, a output current sink 360, a noise cancelling transistor ($M_D$) 370, a source follower transistor ($M_{SF}$) 380, and a current sink 390. Error amplifier 310 has a positive input terminal, a negative input terminal, an output, and a voltage supply input terminal. Error amplifier 310 has a positive input terminal 310a, a negative input terminal 310b, an output 310c, and a voltage supply input terminal 310d. The voltage supply input terminal 310d is coupled to an input voltage Vin. The negative input terminal 310b is coupled to one end of feedback resistor 330 and one end of resistor 340. The other end of resistor 340 is coupled to ground. The output of error amplifier 310 is coupled to a gate of source follower transistor 380.

Pass transistor $M_O$ 320 is a p-type metal oxide semiconductor transistor (PMOS). A source of pass transistor $M_O$ 320 is configured to receive Vin, and a drain of pass transistor $M_O$ 320 is configured to produce an output voltage Vout of LDO 300. In some implementations, Vout is at about 0.7 V. The drain of pass transistor $M_O$ 320 is coupled to a source of source follower transistor 380, load capacitor 350, and output current sink 360. Load capacitor 350 and output current sink 360 are coupled to each other in parallel between the drain of pass transistor $M_O$ 320 and ground. A gate of pass transistor $M_O$ 320 is coupled to a gate and a drain of noise cancelling transistor $M_D$ 370, which are further coupled to a drain of source follower transistor 380. A source of noise cancelling transistor $M_D$ 370 is coupled to the source of pass transistor $M_O$ 320 to receive Vin. The drain of source follower transistor 380 is coupled to current sink 390.

In some implementations, error amplifier 310 includes a pair of input NMOS 311 and 312, a pair of PMOS 313 and 314, a compensation capacitor 315, and a bias current source 316. Both sources of NMOS 311 and 312 are coupled to bias current source 316, which is further coupled to ground. The gates of NMOS 311 and 312 are configured to receive a reference voltage Vref and a feedback voltage, respectively. The gate of NMOS 312 is coupled to feedback resistor 330 and resistor 340 to receive the feedback voltage from the output of LDO 300 (i.e., the drain of pass transistor $M_O$ 320). A drain of NMOS 312 is configured to provide an output of error amplifier 310 at the output terminal 310c, and the drain of NMOS 312 is coupled to compensation capacitor 315. The pair of PMOS 313 and 314 are coupled to each other at their sources at voltage supply input terminal 310d to receive Vin. The gates of PMOS's 313 and 314 are further coupled together to a drain of PMOS 313 and the drain of NMOS 311. The drain of PMOS 314 is coupled to the output 310c of error amplifier 310 with the compensation capacitor 315 and the drain of NMOS 312.

Figure 1:
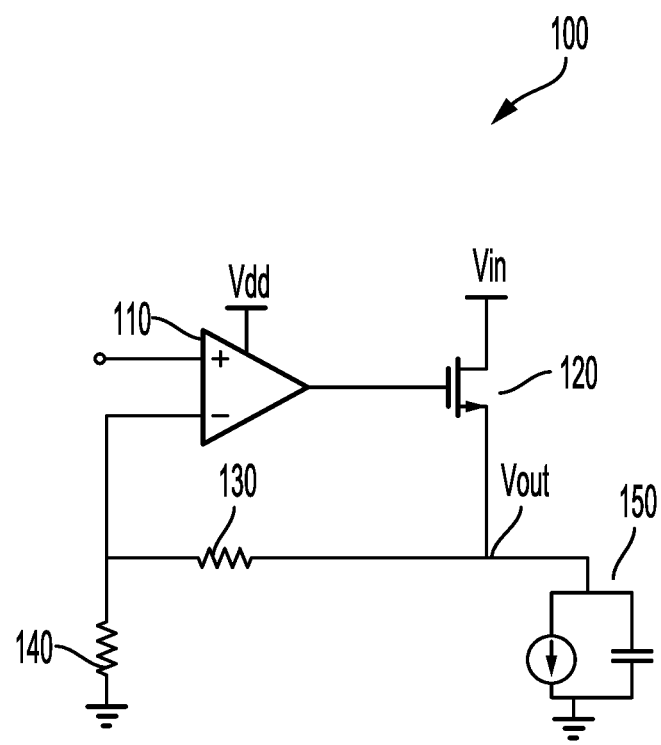
FIG. 1 shows a conventional n-type output LDO 100.
Figure 2:
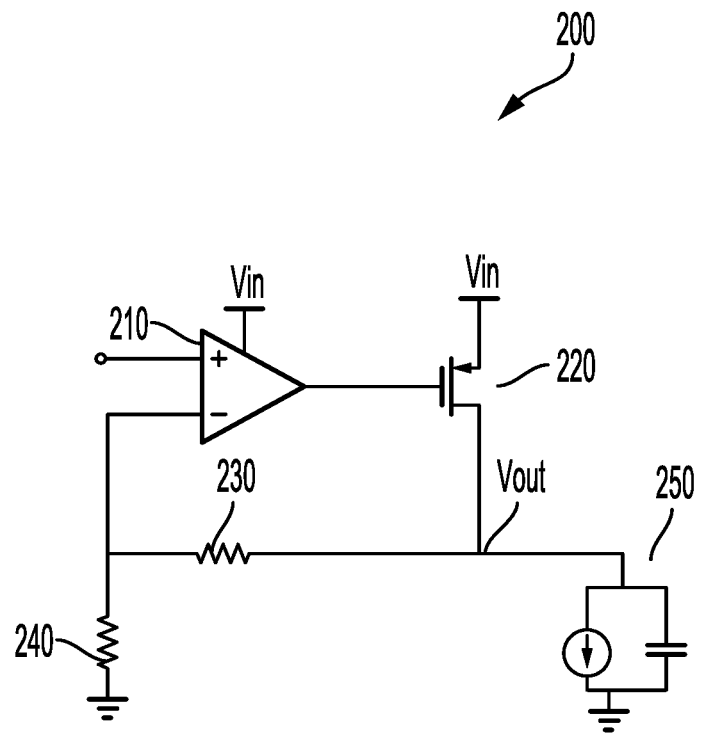
FIG. 2 shows a conventional p-type output LDO 200.

During operation, error amplifier 310, and source follower transistor $M_{SF}$ 380 create a slow loop to define the output voltage Vout. Error amplifier 310 receives Vin at its voltage supply input terminal 310d and a reference voltage Vref at its positive input terminal 310a. The output 310c of error amplifier 310 drives the gate of source follower transistor $M_{SF}$ 380, causing the source of source follower transistor $M_{SF}$ 380 to generate an output DC voltage of Vout. Vout is feedback to the negative input terminal 310b of error amplifier 310 via feedback resistor 330. Thus, when Vout drops, the output voltage of error amplifier 310 goes up. With the gate-source voltage (Vgs) of source follower transistor $M_{SF}$ 380 staying the same, the source voltage of source follower transistor $M_{SF}$ 380 (i.e., Vout of LDO 300) will also go up in response. Such a slow loop provides a low resistance at the output of LDO 300 (i.e., the node at which the drain of pass transistor $M_O$ 320 and the source of source follower transistor $M_{SF}$ 380 are coupled to), and hence, the transient response of Vout is better than the conventional p-type output LDO 200 shown in FIG. 2. Because of the good transient response, LDO 300 does not require large compensation capacitor. For example, a compensation capacitor 315 of about 100 fF would suffice. However, the transient current at the output of LDO 300 can be quite large sometimes, such as, for example, rising from 1 mA to 10 mA in some implementations. Therefore, a second loop, which is also referred to as a fast loop, is configured within LDO 300 to address this issue.

In some implementations, a fast loop within LDO 300 is configured to include pass transistor $M_O$ 320, noise cancelling transistor $M_D$ 370, and source follower transistor $M_{SF}$ 380. Pass transistor $M_O$ 320 is biased with a large load current from load current sink 360. As shown in FIG. 3, the sources of both noise cancelling transistor $M_D$ 370 and pass transistor $M_O$ 320 are coupled to the voltage rail supplying Vin. Noise cancelling transistor $M_D$ 370 and pass transistor $M_O$ 320 are coupled to each other at their gates. Further, noise cancelling transistor $M_D$ 370 is diode connected to create a low resistance from the supply rail carrying Vin to the gate of pass transistor $M_O$ 320. Thus, noise cancelling transistor $M_D$ 370 brings supply noise from Vin to the gate of pass transistor $M_O$ 320. As a result, the supply noise across pass transistor's $M_O$ 320 gate-source voltage $V_{GS}$ can be suppressed. The small signal gain from Vin to the gate of noise cancelling transistor $M_D$ 370 can function as noise cancelling to improve PSRR. Moreover, the fast loop gives higher bandwidth, which also helps to improve PSRR and transient response.

Figure 4A:
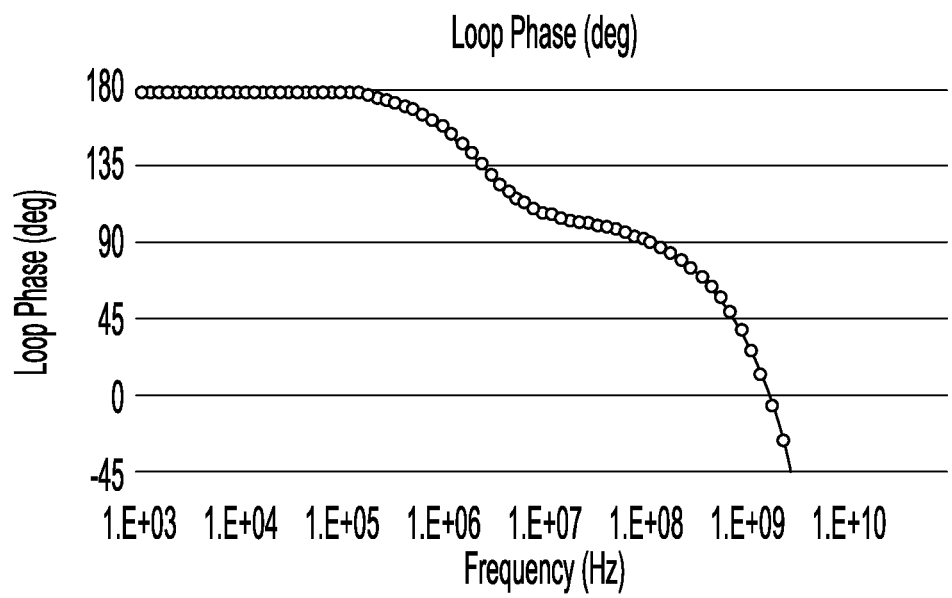
FIG. 4A shows a loop phase plot of LDO 300 in one study of the slow loop of LDO 300.
Figure 4B:
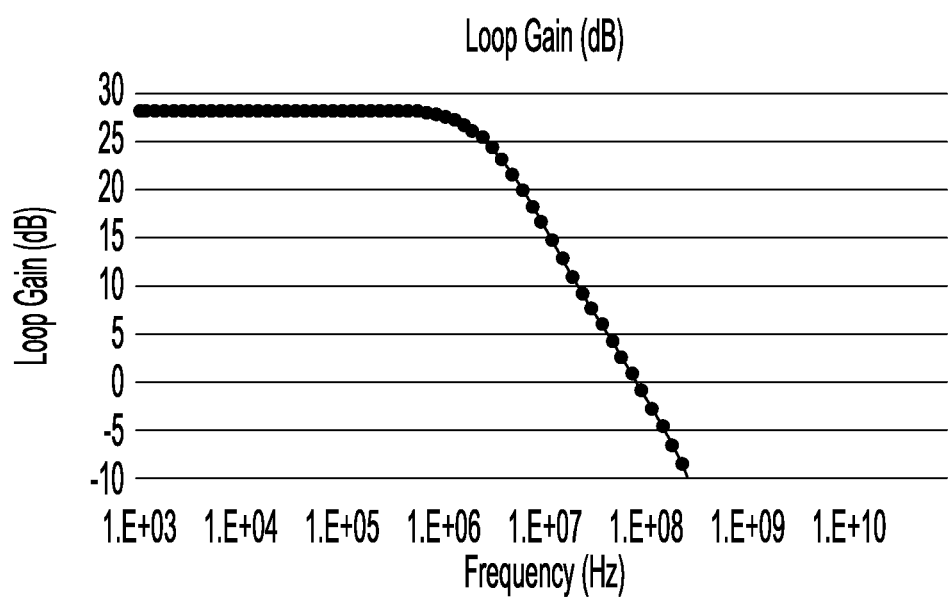
FIG. 4B shows a loop gain plot of LDO 300 in one study of the slow loop of LDO 300.

FIG. 4A shows a loop phase plot and FIG. 4B shows a loop gain plot of LDO 300 in one study of the slow loop of LDO 300. Referring to FIG. 4A, LDO 300 has a phase margin of about 90 degrees. As shown in FIG. 4B, LDO 300 provides about 28 dB DC gain and a gain-bandwidth of about 100 MHz. In sum, the plots in FIGS. 4A-4B demonstrate that the slow loop of LDO 300 is relatively stable.

Figure 4C:
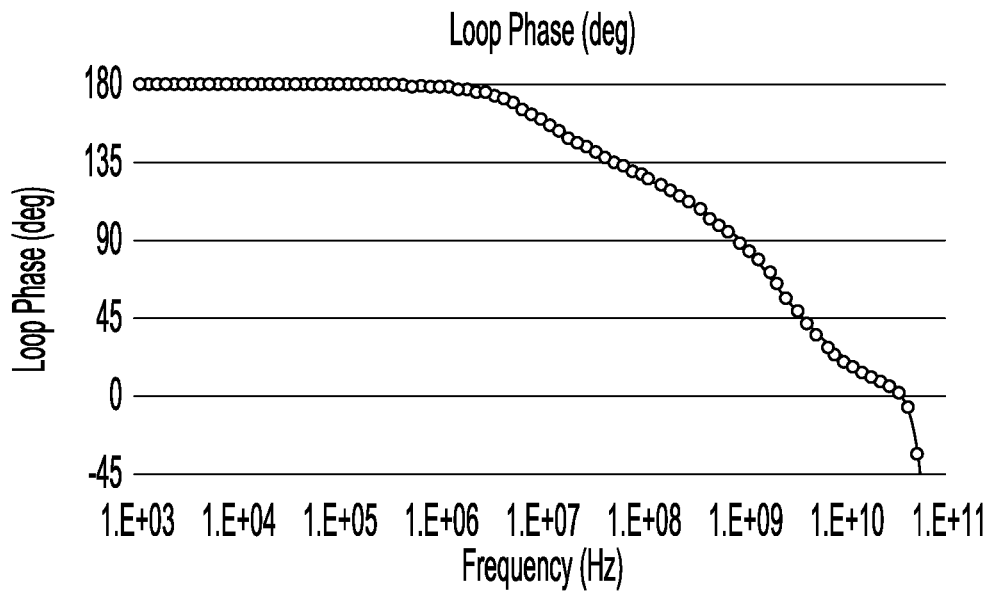
FIG. 4C shows another loop phase plot of LDO 300 in one study of the fast loop of LDO 300.
Figure 4D:
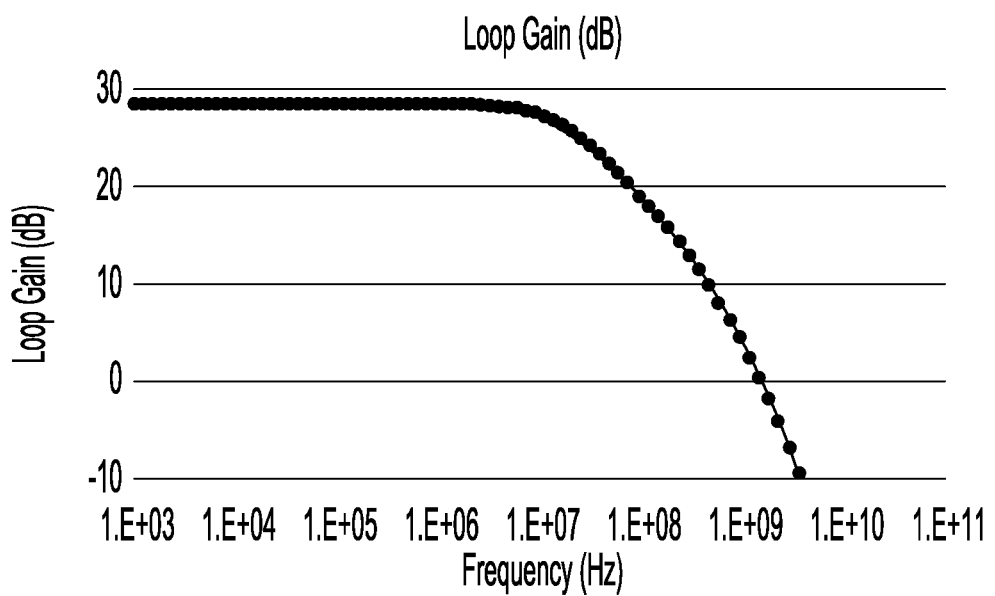
FIG. 4D shows another loop gain plot of LDO 300 in one study of the fast loop of LDO 300.

FIG. 4C shows another loop phase plot and FIG. 4D shows another loop gain plot of LDO 300 in one study of the fast loop of LDO 300. Referring to FIG. 4C, LDO 300 has a phase margin of about 77 degrees and a gain-bandwidth of about 2 GHz. As shown in FIG. 4D, LDO 300 has a loop gain of about 28 dB.

Figure 4E:
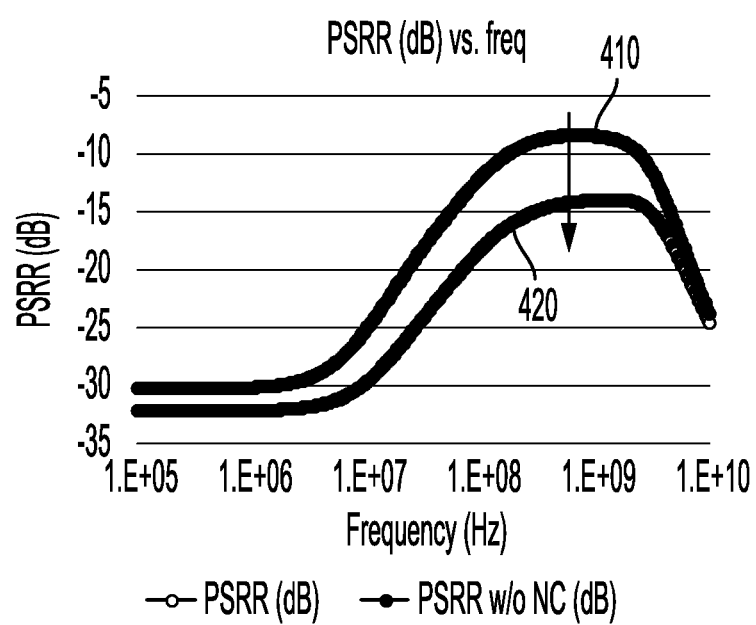
FIG. 4E shows a PSRR plot of one implementation of LDO 300.

FIG. 4E shows a PSRR plot of one implementation of LDO 300. At low frequency, the high gain loop reduces the PSRR. At high frequency, the load capacitor 350 reduces the PSRR. At mid-range frequencies, the fast loop reduces PSR to about −8 dB (see curve 410 in FIG. 4E) according to simulation, assuming noise cancelling transistor $M_D$ 370 is coupled to a clean voltage supply which means there is no noise cancelling. The fast loop takes advantage of high load current and has high gain-bandwidth. The noise cancelling transistor $M_D$ 370, which is diode-connected, limits the DC gain for the fast loop to create enough phase margin for the fast loop of LDO 300. As discussed above with reference to FIG. 3, the diode connected noise cancelling transistor $M_D$ 370 feeds the supply noise from Vin to the gate of pass transistor $M_O$ 320. The supply noise across pass transistor's $M_O$ 320 gate-source voltage $V_{GS}$ is suppressed. In the example shown in FIG. 4E, because the supply noise across pass transistor $M_O$ 320 VGS is suppressed, PSR is further reduced to about −14 dB (see curve 420).

Figure 5:
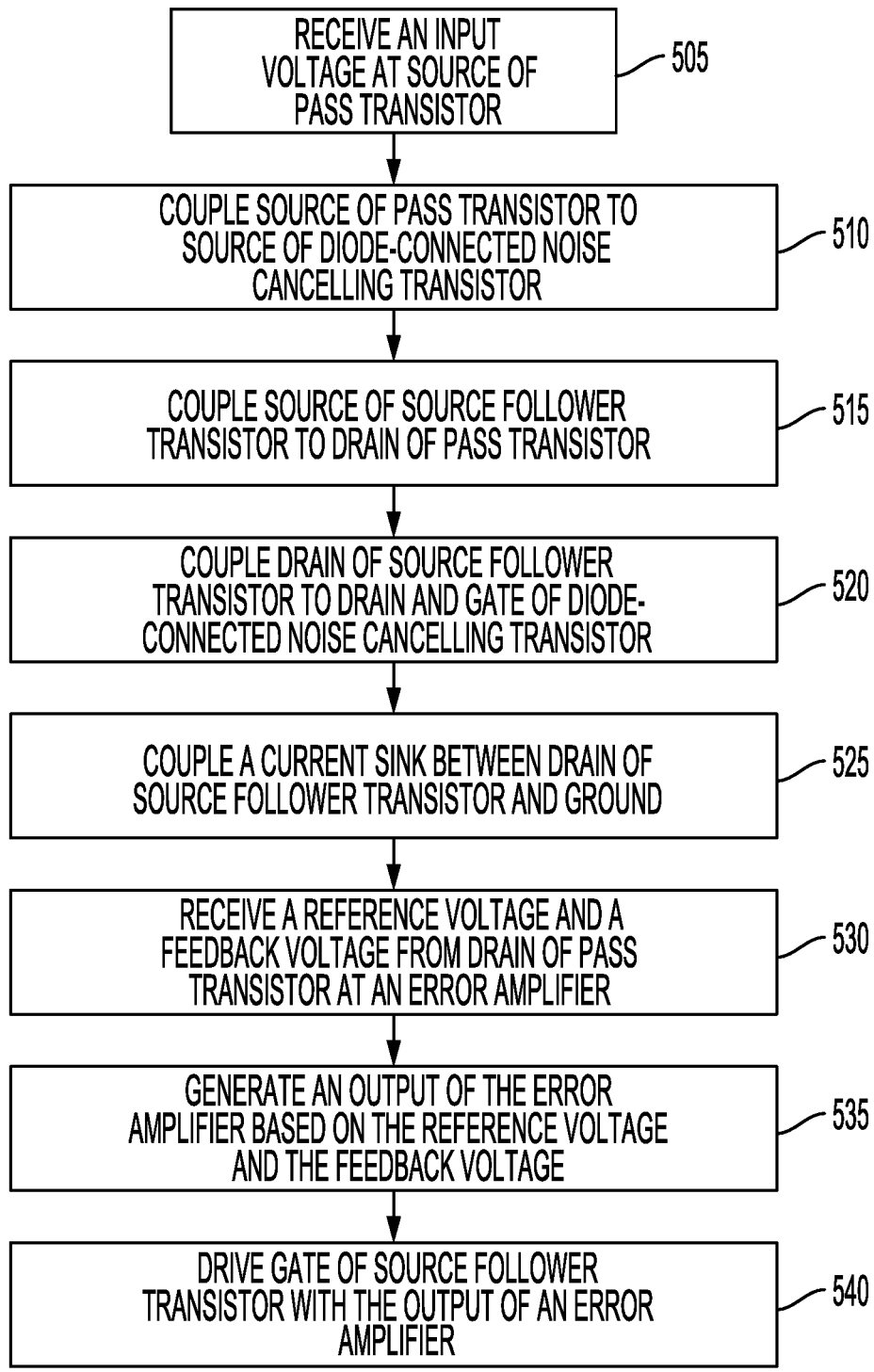
FIG. 5 shows a flow diagram of one implementation of a method to provide a regulated low voltage from an input voltage (Vin).

FIG. 5 shows a flow diagram of one implementation of a method to provide a regulated low voltage from an input voltage (Vin). At box 505, a source of a pass transistor (e.g., $M_O$ 320 in FIG. 3) receives an input voltage Vin. At box 510, the source of the pass transistor is coupled to a source of a diode-connected noise cancelling transistor (e.g., $M_{NC}$ 370 in FIG. 3). At box 515, a source of a source follower transistor (e.g., $M_{SF}$ 380 in FIG. 3) is coupled to a drain of the pass transistor. At box 520, a drain of the source follower transistor is coupled to a drain and a gate of the noise cancelling transistor. At box 525, a current sink (e.g., current sink 390 in FIG. 3) is coupled between the drain of the source follower transistor and ground. In some implementations, the pass transistor, the source follower transistor, and the noise cancelling transistor can be configured into a fast loop of the LDO.

At box 530, an error amplifier (e.g., error amplifier 310 in FIG. 3) receives a reference voltage and a feedback voltage from the drain of pass transistor. The feedback voltage can be passed to the error amplifier via a feedback resistor (e.g., feedback resistor 330 in FIG. 3). At box 535, the error amplifier generates an output voltage based on the reference voltage and the feedback voltage. At box 540, the error amplifier drives the gate of the source follower transistor with its output voltage. In some implementations, the error amplifier, the source follower transistor, and the feedback resistor form a slow loop of the LDO to define the output voltage of the LDO.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A low dropout (LDO) regulator circuit, comprising:
a pass transistor having a source, a drain, and a gate, the source of the pass transistor coupled to an input voltage (Vin), and the drain of the pass transistor configured to provide an output voltage of the LDO regulator circuit;
a source follower transistor having a source, a drain, and a gate, the source of the source follower transistor coupled to the drain of the pass transistor;
a noise canceling transistor coupled between the drain of the source follower transistor and the gate of the pass transistor, wherein the drain of the noise canceling transistor is directly coupled to the drain of the source follower transistor;
a current sink circuit coupled between the drain of the source follower transistor and ground; and
an error amplifier having an output, a positive input terminal, and a negative input terminal, the output coupled to the gate of the source follower transistor, the positive input terminal configured to receive a reference voltage (Vref).

2. The LDO regulator circuit of claim 1, further comprising:
a resistor network to provide a divided voltage to the negative input terminal of the error amplifier, wherein there is at least one transistor coupled between the output of the error amplifier and an input terminal of the resistor network.

3. The LDO regulator circuit of claim 2, wherein the resistor network comprises:
a first resistor coupled between the at least one transistor and the negative input terminal of the error amplifier; and
a second resistor coupled between the ground and the negative input terminal of the error amplifier.

4. The LDO regulator circuit of claim 3, wherein the source follower transistor, the first resistor, and the error amplifier are configured into a first loop.

5. The LDO regulator circuit of claim 1, wherein the pass transistor, the noise canceling transistor, and the source follower transistor are configured into a second loop.

6. The LDO regulator circuit of claim 1, wherein the error amplifier comprises a pair of p-type transistors configured as a current mirror, and sources of the pair of p-type transistors are coupled to the Vin.

7. The LDO regulator circuit of claim 6, wherein the error amplifier further comprises a first n-type transistor configured as the positive input terminal and a second n-type transistor configured as the negative input terminal.

* * * * *